(12) United States Patent
Liang et al.

(10) Patent No.: US 8,378,423 B2
(45) Date of Patent: Feb. 19, 2013

(54) DUAL-GATE TRANSISTOR AND PIXEL STRUCTURE USING THE SAME

(75) Inventors: Chung-Yu Liang, Hsin-Chu (TW); Feng-Yuan Gan, Hsin-Chu (TW); Ting-Chang Chang, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 24 days.

(21) Appl. No.: 13/071,422

(22) Filed: Mar. 24, 2011

(65) Prior Publication Data
US 2011/0168998 A1  Jul. 14, 2011

Related U.S. Application Data

(62) Division of application No. 11/812,002, filed on Jun. 14, 2007, now Pat. No. 7,982,268.

(30) Foreign Application Priority Data

Jun. 15, 2006 (TW) .............................. 95121456 A
Dec. 1, 2006 (TW) .............................. 95144804 A (51) Int. Cl.
*H01L 29/66* (2006.01)
(52) U.S. Cl. ................ 257/365; 257/E21.623
(58) Field of Classification Search .................. 257/365, 257/E21.623
See application file for complete search history.

(56) References Cited

U.S. PATENT DOCUMENTS

| 5,198,379 | A | 3/1993 | Adan |
| 5,580,802 | A | 12/1996 | Mayer et al. |
| 5,818,070 | A | 10/1998 | Yamazaki et al. |
| 6,133,074 | A | 10/2000 | Ishida et al. |
| 6,862,008 | B2 | 3/2005 | Yamazaki et al. |
| 2002/0158829 | A1 | 10/2002 | Yamazaki et al. |
| 2003/0034806 | A1 | 2/2003 | Azami |
| 2004/0174349 | A1* | 9/2004 | Libsch et al. ............... 345/204 |
| 2004/0246765 | A1 | 12/2004 | Kato |
| 2006/0189049 | A1* | 8/2006 | Afentakis et al. ........... 438/151 |
| 2008/0224224 | A1 | 9/2008 | Vandenderghe et al. |

FOREIGN PATENT DOCUMENTS

| CN | 1719616 A | 1/2006 |
| JP | 11-261097 A | 9/1999 |
| TW | 471182 B | 1/2002 |
| TW | 495986 B | 7/2002 |
| TW | 250654 B | 3/2006 |
| WO | WO 96/22616 A1 | 7/1996 |

\* cited by examiner

*Primary Examiner* — Thao Le
*Assistant Examiner* — Geoffrey Ida
(74) *Attorney, Agent, or Firm* — Birch, Stewart, Kolasch & Birch, LLP (57) ABSTRACT

A dual-gate transistor includes a first gate formed on a substrate, a first dielectric layer covering the first gate and the substrate, a semiconductor layer formed on the first dielectric layer, first and second electrodes formed on the semiconductor layer and spaced with an interval in order to separate each other, a second dielectric layer covering the first and second electrodes, and a second gate formed on the second dielectric layer, in which at least one of the first and second gates is non-overlapped with the second electrode.

19 Claims, 10 Drawing Sheets

DUAL-GATE TRANSISTOR AND PIXEL STRUCTURE USING THE SAME

This application is a Divisional of application Ser. No. 11/812,002, filed on Jun. 14, 2007, now U.S. Pat. No. 7,982,268 which claims priority to Application No. 095121456 filed in Taiwan on Jun. 15, 2005 and Application No. 095144804 filed in Taiwan on Dec. 1, 2006; the entire contents of which are hereby incorporated by reference and for which priority is claimed under 35 U.S.C. §120.

FIELD OF THE INVENTION

The present invention relates to the structure of a transistor, and more particularly, to a dual-gate transistor and pixel structure having the dual-gate transistor.

BACKGROUND OF THE INVENTION

Due to rapid advance and development of the display technology, a TFT-LCD (thin film transistor liquid crystal display) is preferred when compared to CRT type due to its light weight, thinness depth, small volume, and lower radiation. Presently, the TFT-LCD is the main item in the display market. The main object of the manufacturers is to upgrade its display quality, reliability, and reduce or lower the manufacturing cost.

An amorphous silicon thin film transistor is generally used as a switch for the pixel of an LCD or an organic electric-luminescence device (OELD) since the thin film transistor is capable of controlling the current conductivity.

Figure 1:
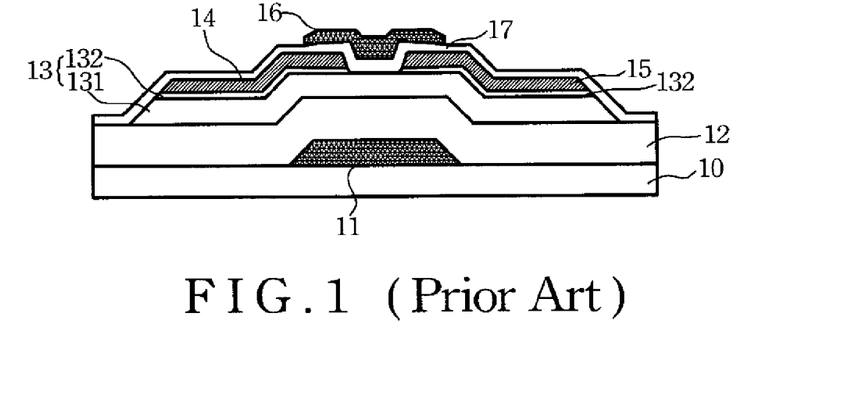
FIG. 1 is a cross-sectional view of a conventional dual-gate transistor.

In recent years, the manufacturers have noted a thin film transistor having dual-gate structure, which is introduced in order to promote the conventional conductivity of the thin film transistors within the LCD. FIG. 1 shows a cross sectional view of a conventional dual-gate transistor fabricated on a substrate 10. The conventional dual-gate transistor includes a first gate 11, a second gate 16, a semiconductor layer 13, a drain 14, and a source 15.

The first gate 11 is formed on the substrate 10. The semiconductor layer 13 is formed on the first gate 11, and includes a channel layer 131 and a doped semiconductor layer 132. The drain 14 and source 15 are substantially corresponding to the two sides of the first gate 11 and are formed on the doped semiconductor layer 132. The drain 14, the source 15, and the semiconductor layer 13 have contacted areas is formed by the doped semiconductor layer 132. The second gate 16, is corresponding to the first gate 11, formed on the drain 14 and source 15, and has left and right end sections covering two ends of the drain 14 and source 15. The second gate 16 is electrically coupled to the first gate 11.

The conventional dual-gate transistor further includes a first dielectric layer 12 formed on the substrate 10 and covering the first gate 11, and a second dielectric layer 17 covering on the drain 14 and source 15 and located below the second gate 16. In other words, the second dielectric layer 17 is sandwiched between the second gate 16 and the drain 14 and source 15.

The above-mentioned conventional dual-gate transistor can provide a better current conductivity when compared to a conventional single-gate transistor, and thus reduces the crowding effect of electric field, thereby effectively improving the photo leakage current problem.

In the conventional dual-gate transistor, the left and right end sections of the second gate 16 covering respectively on the ends of the drain and source 14, 15 lead to increase of the parasitic capacitance (Cgs) at the covering position of the second gate 16 and the source 15 when the LCD is under the operation. Note that the parasitic capacitance increasing results in higher feed through voltage and then affects the operating voltage of the pixel electrode and the accuracy of gray values for displaying an image on the display panel.

It is thus desirable and advantageous to provide a dual-gate transistor that is capable of effectively reducing the occurrence of the parasitic capacitance so as to eliminate the above-mentioned influence.

SUMMARY OF THE INVENTION

In general and in one aspect, the present invention is related to and provides a dual-gate transistor having at least one of a first gate and a second gate arranged not to cover a second electrode so as to reduce the occurrence of the parasitic capacitance between at least one of the first and second gates and the second electrode and to reduce the feed through voltage to improve the performance and the reliability of the dual-gate transistor. The dual gate transistor includes a substrate, a first gate formed on the substrate, a first dielectric layer covering on the first gate and the substrate, a semiconductor layer formed on the first dielectric layer and the first gate, a first and second electrodes, formed on the semiconductor layer, and spaced from each other with an interval therebetween, a second dielectric layer formed on the substrate, and covering the first electrode, second electrode and portion of the semiconductor layer, and a second gate formed on the second dielectric layer, so that at least one of the first and second gates is non-overlapped with the second electrode.

In general and in another aspect, the present invention is to provide a dual-gate transistor having first and second gates, at least one of the first and second gates is non-overlapped the second electrode (or a first doping region electrically connected to the second electrode) in the perpendicular cast upon position. Therefore, during the driving process of the display, the resulted parasitic capacitance within the dual-gate transistor is subsequently reduced since at least one of the first and second gates is non-overlapped with the second electrode (or the first doping region connected electrically to the second electrode). The dual-gate transistor includes a substrate, a first gate formed on the substrate, a first dielectric layer formed on and covering the first gate and the substrate, a semiconductor layer formed on the first dielectric layer and the first gate, having two first doping regions at two opposite sides thereof, a second dielectric layer formed on the semiconductor layer and the substrate, a second gate formed on the second dielectric layer, a third dielectric layer covering the second gate and the substrate, and first and second electrodes formed on the third dielectric layer and electrically connected to the first doping regions of the semiconductor layer, respectively. The first and second electrodes are spaced from each other with an interval therebetween. At least one of the first and second gates is non-overlapped with one of the first doping regions in the semiconductor layer and/or the second electrode.

In general and in further aspect, the present invention is to provide a pixel structure including the above-mentioned dual-gate transistor. The pixel structure is designed in such a manner that the pixel electrodes within the LCD have better stable operating voltage, thereby providing a stable gray level. The pixel structure is incorporated to the above-mentioned dual-gate transistor. The pixel structure further includes at least one capacitor and at least one signal line having a scan line and a data line.

BRIEF DESCRIPTION OF THE DRAWINGS

Other features and advantages of the present invention will become more apparent in the following detailed description of the preferred embodiments of the present invention, with reference to the accompanying drawings, in which.

DETAILED DESCRIPTIONS OF THE PREFERRED EMBODIMENTS

Figure 2:
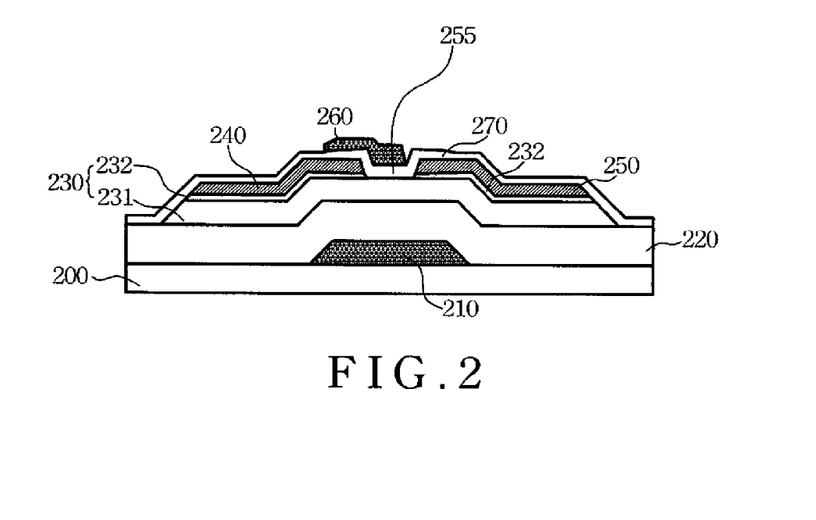
FIG. 2 is a cross-sectional view of the first embodiment of a dual-gate transistor of the present invention.

Referring to FIG. 2, which is a cross-sectional view of the first embodiment of a dual-gate transistor of the present invention fabricated on a substrate 200, and the dual-gate transistor includes a first gate 210, a first dielectric layer 220, a semiconductor layer 230, first and second electrodes 240, 250, a second dielectric layer 270, and a second gate 260.

As illustrated in FIG. 2, the first gate 210 is formed on the substrate 200. The first dielectric layer 220 is formed to cover the first gate 210 and the substrate 200. The semiconductor layer 230 is formed on the first dielectric layer 220 over the first gate 210. The first and second electrodes 240, 250 are formed on the semiconductor layer 230, and are spaced by an interval 255 therebetween in order to separate each other, thereby exposing a portion of the semiconductor layer 230 at the interval 255.

Further, the first and second electrodes 240, 250 have inner ends defining the interval 255 therebetween, and the ends of the first and second electrodes 240, 250 cover two opposite end sections of the first gate 210, respectively. In other words, the interval 255 is substantially cast upon the first gate 210, so that the first electrode 240 and the second electrode 250 are substantially cast upon two opposite end sections of the first gate 210, respectively. The second dielectric layer 270 is formed on and thus covers the first electrode 240 and the second electrode 250 and a portion of the semiconductor layer 230. The semiconductor layer 230, preferably, includes a channel layer 231 and a doped semiconductor layer 232 formed on the channel layer 231, such that the first and second electrodes 240, 250 have a contact area in contact with the doped semiconductor layer 232.

The second gate 260 is formed on the second dielectric layer 270 in such a manner that the second gate 260 is overlapped with the first electrode 240 and non-overlapped with the second electrode 250. The second gate 260 has one end section that is located adjacent to the inner end of the second electrode 250, that covers at least one portion of the interval 255 and that is non-overlapped the second electrode 250. The second gate 260 has another end section that is away from the inner end of the second electrode 250 and that covers a portion of the first electrode 240. In other words, one end section of the second gate 260 is adjacent to a sidewall of the second electrode 250 and, preferably, is overlapped with at least one third of the second dielectric layer 270 within the interval 255 while another end section of the second gate 260 is away from the sidewall of the second electrode 250 and substantially aligns with the first electrode 210. In other words, the second gate 260, preferably, is overlapped with at least one third of the second dielectric layer 270 within the interval 255.

Note that when the second gate 260 is viewed in the perpendicular direction to the substrate 200 (from top or bottom side), the right end section of the second gate 260 covers substantially more than or substantially equal to one third area of the interval 255 and is non-overlapped with the second electrode 250 while the left end section of the second gate 260 covers the first electrode 240. In other words, the second gate 260 covers the interval 255 partially and thus occupies substantially more than or substantially equal to one-third area of the interval 255.

In the present embodiment, the material of the substrate 200 includes a transparent substrate (such as glass substrate, quartz substrate, or likes), a flexible substrate (such as acryl polymer, ester polymer, rubber, epoxy polymer, or likes) or a opaque substrate (such as ceramic, silicon, or likes). At least one of the materials of the first and second gates 210, 260 includes transparent conductive material (such as indium tin oxide (ITO), indium zinc oxide (IZO), aluminum zinc oxide (AZO), or likes), metal (such as Al, Cr, Ti, W, Ta, Cu, Au, Ag, Mo, Nd, or likes), metal alloy, or combinations thereof.

The materials of the semiconductor layer 230 include amorphous silicon, poly silicon, mono-crystalline silicon, microcrystalline silicon, or combinations thereof. At least one of the materials of the first and second electrodes 240, 250 includes transparent conductive material (such as indium tin oxide (ITO), indium zinc oxide (IZO), aluminum zinc oxide (AZO), or likes), metal (such as Al, Cr, Ti, W, Ta, Cu, Au, Ag, Mo, Nd, or likes), metal alloy, or combinations thereof. At least one of the materials of the first and second dielectric layers 220, 270 includes inorganic components (such as silicon nitride, silicon oxide, silicon oxynitride, silicon carbide, or likes), organic components (such as silicon organic material, photo-resist, polymer, or likes), or combinations thereof.

Since the first and second gates 210, 260 are electrically connected to each other and when an operation voltage is transmitted to the first and second gates 210, 260, an induced charge will be resulted and thus a current flow at the interfaces between the first dielectric layer 220 and the semiconductor layer 230 and between the second dielectric layer 270 and the semiconductor layer 230. In addition, the biasing on the second gate 26 reduces the threshold voltage of the transistor. Therefore, the dual-gate transistor of the present invention provides a better current conductivity when compared to the conventional dual-gate transistor.

Figure 3:
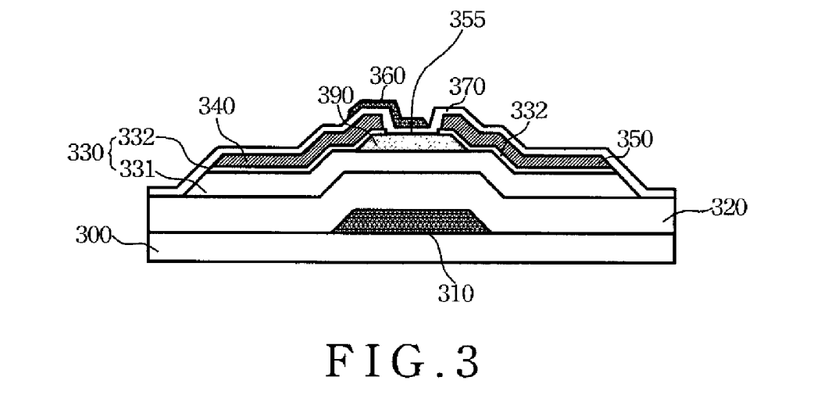
FIG. 3 is a cross-sectional view of the second embodiment of the dual-gate transistor of the present invention.

Referring to FIG. 3, which is a cross-sectional view of the second embodiment of the dual-gate transistor of the present invention fabricated on a substrate 300. The dual-gate transistor includes a first gate 310, a first dielectric layer 320, a semiconductor layer 330, a first electrode 340, a second electrode 350, a second dielectric layer 370, and a second gate 360. In present embodiment of the invention, the semiconductor layer 330, preferably, includes a channel layer 331 and a doped semiconductor layer 332. Therefore, the first and second electrodes 340, 350 have a contact area in contact with the doped semiconductor layer 332.

The present embodiment of the invention has the structure similar to the first embodiment. The only difference resides in that an isolating layer 390 is formed on the semiconductor layer 330 between the first and second electrodes 340, 350 in such a manner that the first and second electrodes 340, 350 have the ends covering two opposite ends of the isolating layer 390 to define the interval 355 above the isolating layer 390. The first and second electrodes 340, 350 extend outward from the two opposite ends of the isolating layer 390. Under this condition, the isolating layer 390 protects the semiconductor layer 330 from being damaged when lithographic and etching processes are conducted upon the first and second electrodes 340, 350. Generally speaking, the materials of the isolating layer 390 include inorganic material (such as silicon nitride, silicon oxide, silicon oxynitride, silicon carbide, or likes), organic material (such as silicon organic material, photo-resist, polymer, or likes), or a combination thereof.

Figure 4:
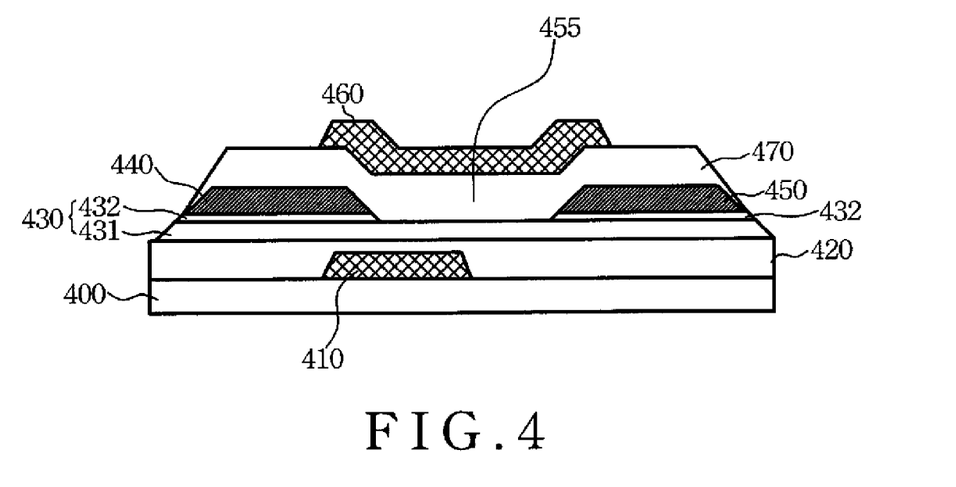
FIG. 4 is a cross-sectional view of the third embodiment of the dual-gate transistor of the present invention.

Referring to FIG. 4, which is a cross-sectional view of the third embodiment of the dual-gate transistor of the present invention fabricated on a substrate 400. The dual-gate transistor includes a first gate 410, a first dielectric layer 420, a semiconductor layer 430, first and second electrodes 440, 450, a second dielectric layer 470, and a second gate 460.

As illustrated in FIG. 4, the first gate 410 is formed on the substrate 400. The first dielectric layer 420 is formed to cover the first gate 410 and the substrate 400. The semiconductor layer 430 is formed on the first dielectric layer 420. The first and second electrodes 440, 450 are formed on the semiconductor layer 430, and have inner ends defining an interval 455 therebetween in order to separate each other, thereby exposing a portion of the semiconductor layer 430 at the interval 455. The second dielectric layer 470 is formed on the first and second electrodes 440, 450, and covers the portion of the semiconductor layer 430. The second gate 460 is formed on the second dielectric layer 470. In present embodiment of the invention, the semiconductor layer 430, preferably, includes a channel layer 431 and a doped semiconductor layer 432 formed on the channel layer 431 such that the first and second electrodes 440, 450 have a contact area in contact with the doped semiconductor layer 432.

Note that the right end section of the first gate 410 adjacent to the second electrode 450 is non-overlapped with the second electrode 450 while the left end section thereof distal to the second electrode 450 overlaps with the first electrode 440. In other words, one end section of the first gate 410 is adjacent to a sidewall of the second electrode 450 and substantially overlaps with at least one third of the second dielectric layer 470 within the interval 455. Another end section of the first gate 410 is away from the sidewall of the second electrode 450 and substantially overlaps with the first electrode 440. The first gate 410 is substantially overlapped with at least one third of the second dielectric layer 470 within the interval 455.

When the first gate 410 is viewed in the perpendicular direction (from the top or bottom side), the right end section of the first gate 410 covers at least one-third area of the interval 455, but is non-overlapped with the second electrode 450 while the left end section of the first gate 410 covers the first electrode 440. In other words, the first gate 410 covers partially the interval 455 and thus occupies at least one-third area of the interval 455.

In addition to the above-mentioned embodiments, the transistor of the present invention may have semiconductor layer of different structure and the corresponding structures are described in the following paragraphs.

Figure 5A:
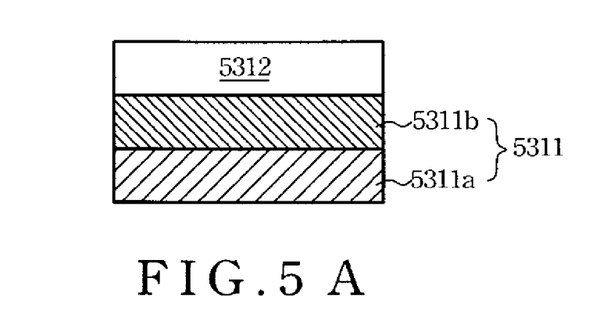
FIGS. 5A to 5H respectively show a semiconductor layer incorporated in any embodiment of the dual-gate transistor of the present invention.

In general, the semiconductor layer selectively includes a channel layer and/or a doped semiconductor layer, and the channel layer could be a non-doped semiconductor layer incorporated in the any embodiment of the present, but is not limited thereto. FIGS. 5A to 5H respectively show a semiconductor layer incorporated in any embodiment of the dual-gate transistor of the present invention. The any embodiment is mean to include the above-mentioned embodiment of the present invention and/or the follow-up embodiment of the present invention. In FIG. 5A, the semiconductor layer selectively includes a channel layer and/or a doped semiconductor layer. In FIG. 5A, for example, the semiconductor layer includes a channel layer 5311 and a doped semiconductor layer 5312. The channel layer 5311 may include a first lightly doped sub-layer 5311a and a second lightly doped sub-layer 5311b formed on the first lightly doped sub-layer 5311a. The doped semiconductor layer 5312, preferably, has a doped density substantially greater than that of the first and second lightly doped sub-layers 5311a, 5311b. The first and second lightly doped sub-layers 5311a, 5311b may have substantially the same or substantially different doped density (preferably, the first lightly doped sub-layer 5311a has the doped density substantially lower than that of the second lightly doped sub-layer 5311b).

Figure 5B:
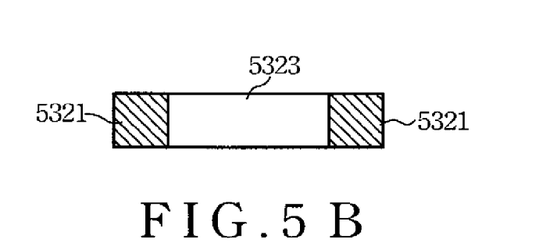

In any embodiment of the present invention, the semiconductor layer includes a first doping region, a second doping region, and a non-doping region. As illustrated in FIG. 5B, for example, the semiconductor layer includes a non-doping region 5323 sandwiched between the first doping regions 5321.

Figure 5C:
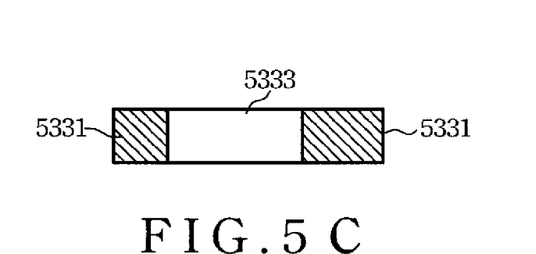

In FIG. 5C, for example, two first doping regions 5331 are located at two opposite sides of the semiconductor layer while a non-doping region 5333 is sandwiched between the first doping regions 5331. The first doping regions 5331 may have substantially different area or substantially different volume.

Figure 5D:
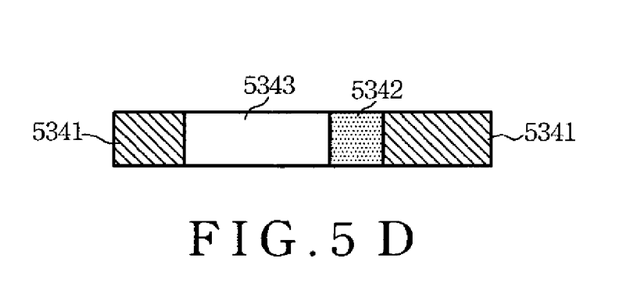

Referring to FIG. 5D, for example, two first doping regions 5341 are located at two opposite sides of the semiconductor layer and the non-doping region 5343. A second doping region 5342 is located between one of the first doping regions 5341 and the non-doping region 5343. In other words, the non-doping region 5343 is juxtaposed with one of the first doping regions 5341 such that the non-doping region 5343 is sandwiched between the other one of the first doping regions 5341 and the second doping region 5342. The first and second doping regions 5341, 5342 selectively have substantially different areas or substantially different volumes and are arranged in a horizontal direction. The first and second doping regions 5341, 5342 may have substantially the same or substantially different doped densities (preferably, the second doping region 5342 may have the doped density substantially lower than that of the first doping regions 5341).

Figure 5E:
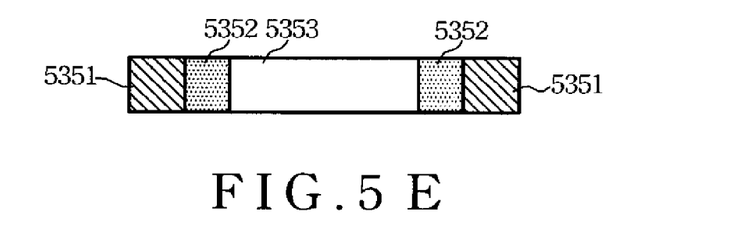

Referring to FIG. 5E, for example, two first doping regions 5351 are located at two opposite sides of the semiconductor layer, the non-doping region 5353 is disposed between the first doping regions 5351, and two second doping regions 5352 are respectively disposed adjacent to the first doping regions 5351 in such a manner that the non-doping region 5353 is sandwiched between the second doping regions 5352. The first and second doping regions 5351, 5352 may have substantially different areas or substantially different volumes and are arranged in a horizontal direction. The first and second doping regions 5351, 5352 may have substantially the same or substantially different doped densities.

Figure 5F:
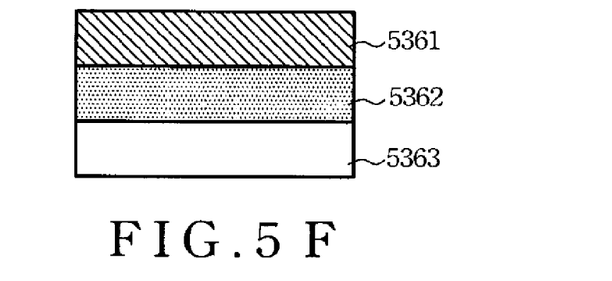

Referring to FIG. 5F, for example, the second doping region 5362 is sandwiched between the first doping region 5361 and the non-doping region 5363, and the whole regions are arranged in a vertical direction. The first and second doping regions 5361, 5362 may have substantially the same or substantially different doped densities.

Figure 5G:
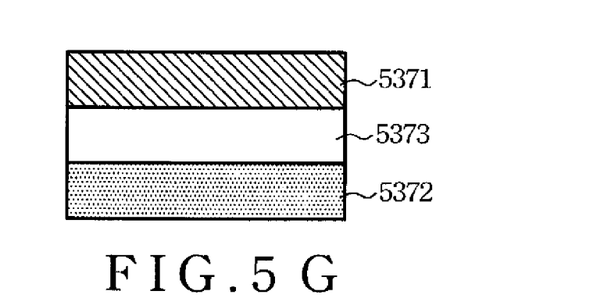

Referring to FIG. 5G, for example, the non-doping region 5373 is sandwiched between the first and second doping region 5371, 5372, and the whole regions are arranged in the vertical direction. The first and second doping regions 5371, 5372 may have substantially the same or substantially different doped densities.

Figure 5H:
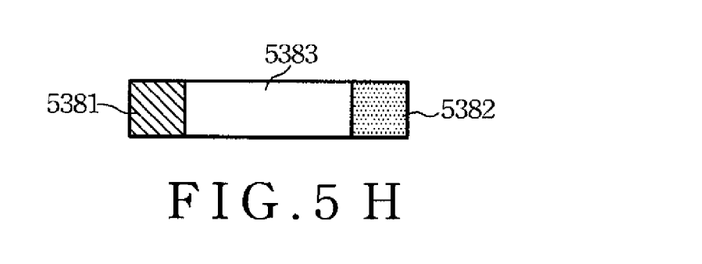

Referring to FIG. 5H, for example, the non-doping region 5383 is sandwiched between the first and second doping region 5381, 5382, which may have substantially different areas or substantially different volumes, the whole regions are arranged in the horizontal direction. The first and second doping regions 5381, 5382 may have substantially the same or substantially different doped densities.

Figure 6:
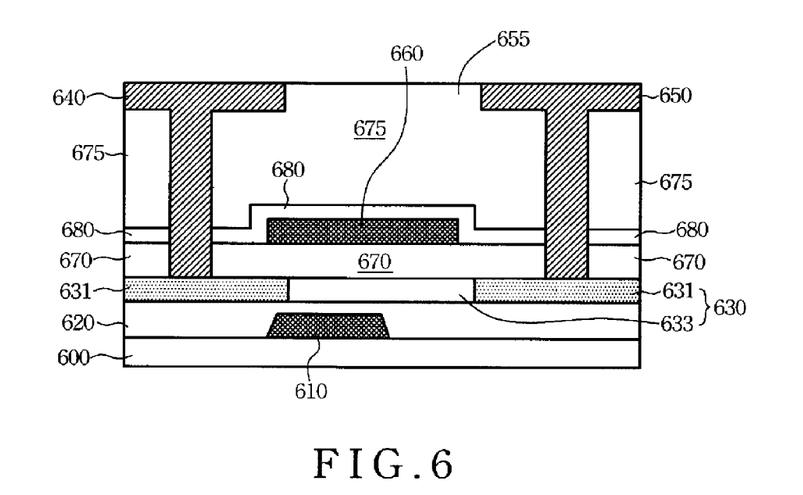
FIG. 6 is a cross-sectional view of the fourth embodiment of the dual-gate transistor of the present invention.

Referring to FIG. 6, which is a cross-sectional view of the fourth embodiment of the dual-gate transistor of the present invention fabricated on the substrate 600, and includes a first gate 610, a first dielectric layer 620, a semiconductor layer 630, a second dielectric layer 670, a second gate 660, a third dielectric layer 675, and first and second electrodes 640, 650.

As illustrated in FIG. 6, the first gate 610 is formed on the substrate 600. The first dielectric layer 620 is formed on and covers the first gate 610 and the substrate 600. The semiconductor layer 630 is formed on the first dielectric layer 620 and the first gate 610, and has two first doping regions 631 at two opposite sides thereof and a non-doping region 633 between the first doping regions 631. The second dielectric layer 670 is formed on the semiconductor layer 630 and the substrate 600. The second gate 660 is formed on the second dielectric layer 670 while the third dielectric layer 675 covers the second gate 660 and the substrate 600.

In addition, the dual gate transistor of the present invention, preferably, includes a fourth dielectric layer 680 disposed between the second and third dielectric layers 670, 675, and covering the second gate 660.

The first and second electrodes 640, 650 are formed on the third dielectric layer 675, and are electrically connected to the first doping regions 631 of the semiconductor layer 630, respectively. The first and second electrodes 640, 650 have inner ends defining an interval 655 therebetween in order to separate each other. Of course, the interval 655 and the non-doping region may have substantially the same or substantially different length according on the design and requirements of the transistor.

Note that in the above-mentioned embodiment of the present invention, at least one of the first and second gates 610, 660 is non-overlapped with one of the first doping regions 631 in the semiconductor layer 630. In one embodiment, one end of the first gate 610 is substantially located under at least one third of the interval 655.

The second gate 660 has a right end section that is located adjacent to the second electrode 650 and that is overlapped with the interval 655 but non-overlapped with the first doping region 631 connected to the second electrode 650. The second gate 660 has a left end section that is located distal to the second electrode 650 and that is overlapped with the first doping region 631 connected to the first electrode 640. In other words, one end section of the second gate 660 is located adjacent to one end section of the first doping region 631 connected to the second electrode 650, and substantially located under a portion of the interval 655. Another end section of the second gate 660 is away from the end section of the first doping region 631 connected to the second electrode 650 and overlaps a portion of the first doping region 631 connected to the first electrode 640. In other words, one sidewall of the second gate 660 is adjacent to one sidewall of the first doping region 631 connected to the second electrode 650 and is substantially located under at least one third of the interval 655. The other sidewall of the second gate 660 is away from the sidewall of the first doping region 631 connected to the second electrode 650 and is substantially overlapped with the first electrode 640.

When the second gate 660 is viewed in the vertical direction (from the top or bottom side), the right end section of the second gate 660 covers at least one third of the area of the interval 655 but is non-overlapped with the first doping region 631 connected to the second electrode 650, while the left end section of the second gate 660 covers partially the first doping region 631 connected to the first electrode 640. In other words, the second gate 660 covers the interval 655 partially and thus occupies at least one-third area of the interval 655.

As illustrated in FIG. 6, the first gate 610 has a right end section that is located adjacent to the first doping region 631 connected to the second electrode 650 and that overlaps and covers at least one third area of the interval 655 and substantially non-overlapped with the first doping region 631 connected to the second electrode 650. The first gate 610 has a left end section that is distal to the first doping region 631 connected to the second electrode 650 and that covers partially the first doping region 631 connected to the first electrode 640. In other words, one sidewall of the first gate 610 is adjacent to one sidewall of the first doping region 631 connected to the second electrode 650 and overlaps at least one third of the non-doping regions 633 between the two first doping regions 631. The other sidewall of the first gate 610 is away from the sidewall of the first doping region 631 connected to the second electrode 650 and is substantially overlapped with the first doping region 631 connected to the first electrode 640. In other words, the first gate 610 is substantially overlapped with at least one third of the interval 655.

When the first gate 610 is viewed in the perpendicular direction (from the bottom side), the right end section of the first gate 610 covers at least one third area of the interval 655, but is non-overlapped with the first doping region 631 connected to the second electrode 650, while the left end section of the first gate 610 overlaps and covers the first doping region 631 connected to the first electrode 640.

In other words, preferably, both the first and second gates 660, 610 partially overlap and cover partially of the interval 655 and occupy at least one third area of the interval 655.

Figure 7:
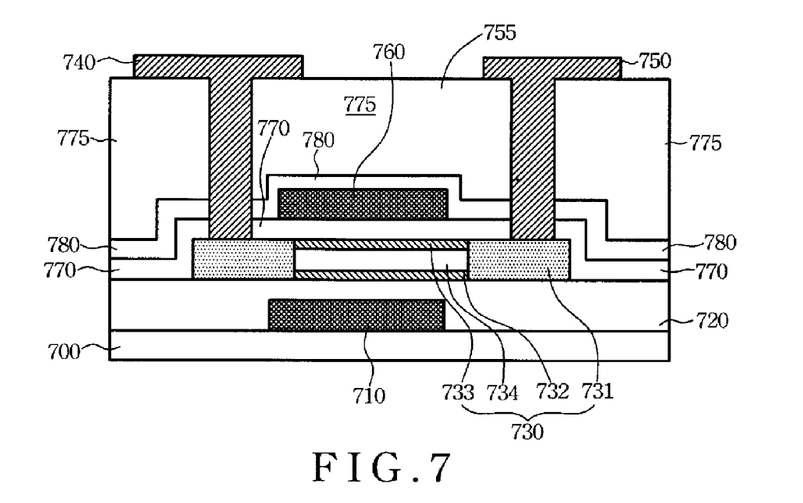
FIG. 7 is a cross-sectional view of the fifth embodiment of the dual-gate transistor of the present invention.

Referring to FIG. 7, which is a cross-sectional view of the fifth embodiment of the dual-gate transistor of the present invention fabricated on a substrate 700. The dual-gate transistor of this embodiment includes a first gate 710, a first dielectric layer 720, a semiconductor layer 730, a second dielectric layer 770, a second gate 760, a third dielectric layer 775, a fourth dielectric layer 780, and first and second electrodes 740, 750.

The semiconductor layer 730 in this embodiment may have the structure shown in FIG. 5B-5E or FIG. 5H.

The fifth embodiment of the present invention has the structure similar to the fourth embodiment, except in that the semiconductor layer 730 further includes a second doping region 732, a third doping region 733, and a non-doping region 734. The non-doping region 734, the second doping region 732, and the third doping region 733 are sandwiched between the first doping regions 731. And, the third doping region 733, the second doping region 732, and the non-doping region 734 are substantially arranged in a vertical direction.

Referring to FIGS. 6 and 7, when viewed along the perpendicular direction (top and bottom sides), at least one of the first gate 610, 710 and the second gate 660, 760 is non-overlapped with the second electrode 650, 750.

Referring to FIGS. 8A to 8D, each of which respectively show one top view of three modifications of the dual-gate transistor of the present invention. The dual-gate transistor includes the semiconductor layer 830, the first electrode 840, a second electrode 850, and the second gate 860, and could be incorporated to the embodiments of the present invention. The transistor has non-symmetric structure along the perpendicular direction. The first electrode 840 has two end portions disposed two opposite sides of the second electrode 850.

Figure 8A:
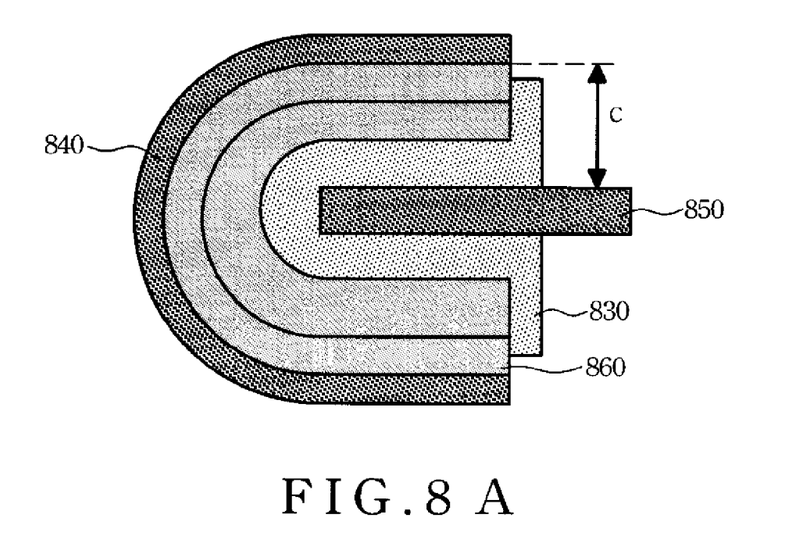
FIGS. 8A to 8D respectively show four different structures of the dual-gate transistor of the present invention when viewed from a topside.

In FIG. 8A, the arrow C denotes the range covered by the second gate 860 on the first electrode 840 with respect to the second electrode 850. In the top view, the second electrode 850 has a rod shape while the first electrode 840 and the second gate 860 both have the substantially U-shaped. The outer side of the second gate 860, as illustrated, is formed to cover the partial first electrode 840. The inner side of the second gate 860 is formed to occupy inwardly at least one third of the interval, or even to occupy the whole interval and reaches the second electrode 850, but non-overlapped with the second electrode 850. It is noted that, in FIG. 8A, the second gate 860, is located in the area of the semiconductor layer 830, and has two end portions substantially aligns with the end portions of the first gate 840, respectively.

Figure 8B:
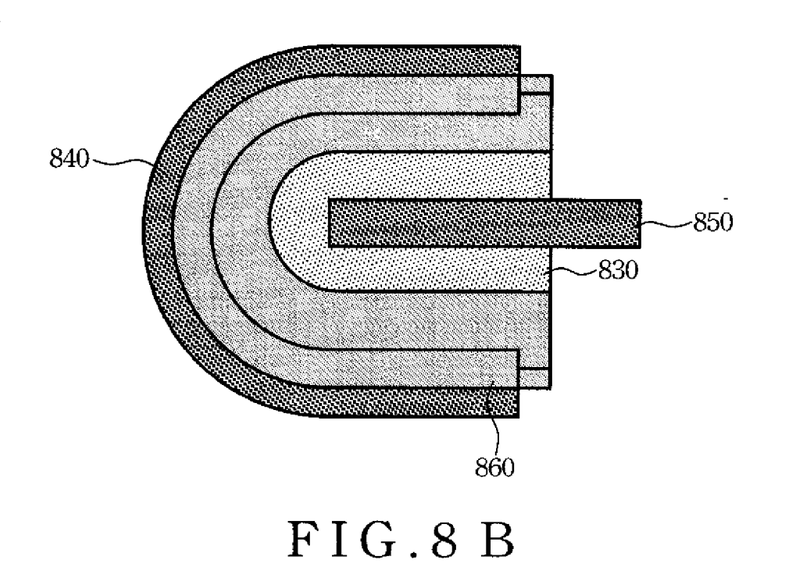

In FIG. 8B, the second gate 860 has two end portions covering an area of the semiconductor layer 830, which is substantially greater than the first gate 840 that also has two end portions covering an area of the semiconductor layer 830.

Figure 8C:
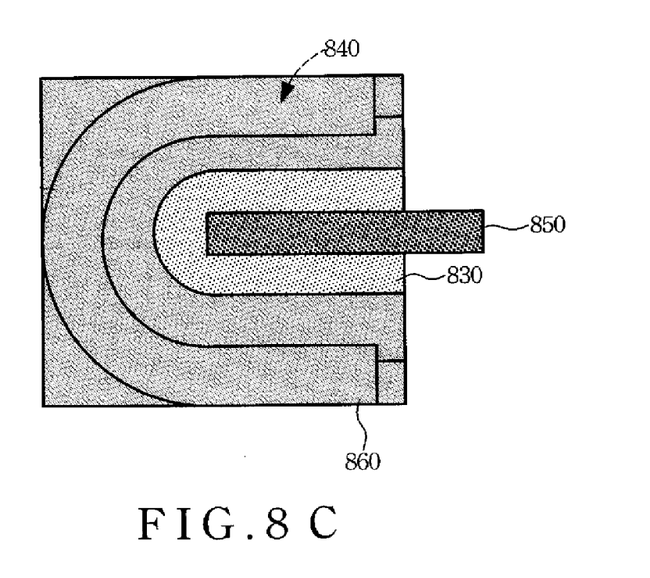

In FIG. 8C, the second gate 860 covers an entire area of the first gate 840 and a portion of the semiconductor layer 830.

Figure 8D:
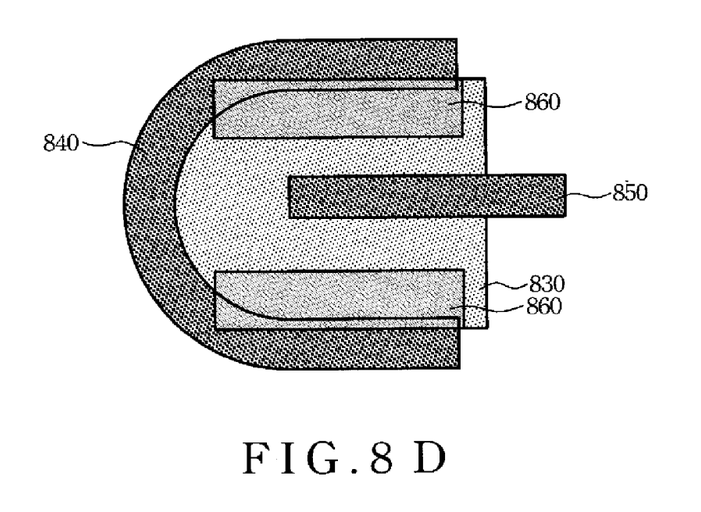

In FIG. 8D, the dual-gate transistor has the same structure, except in that two second gates 860 are incorporated to cover the inner areas of the first gate 840 and a portion of the semiconductor layer 830.

During the fabrication process, there may occur deviation in the exposure for forming the second gate such that two units of second gate are utilized in order to compensate the current flow caused due to upward-and-downward swing movement of the exposuring operation. Once thus arranged, the panel within the entire transistors may have the same characteristic so as to provide a stable current conduction.

The above-mentioned embodiments of the dual-gate transistor can be used in various types display device including LCD, electroluminescence display, field-emission display, nano-carbon tube display. The doping region in the doping semiconductor sub-layer serves as the N-type (such as phosphorous, arsenic, or likes), P-type (such as boron, or likes), or a combination thereof.

Again, referring to FIGS. 2 and 3, since the right end sections of the second gate is non-overlapped with the second electrode (i.e. the source) and when the display device is under the driving process, the resulted parasitic capacitance (Cgs) is subsequently reduced.

In addition, the parasitic capacitance (Cgs) can be generated when the first gate and second electrode cover or overlap each other. So, we can used any of the above-mentioned of the present invention (such as in FIGS. 4, 6 and 7), at least one of the first and second gates is non-overlapped with the second electrode (or the first doping region connected to the second electrode) such that when the display device is under operation, the resulted parasitic capacitance within the dual-gate transistor is subsequently reduced.

In all the embodiments of the dual-gate transistor of the present invention, at least one of the first and second gates is non-overlapped with the second electrode (or the first doping region electrically connected to the second electrode).

Figure 9A:
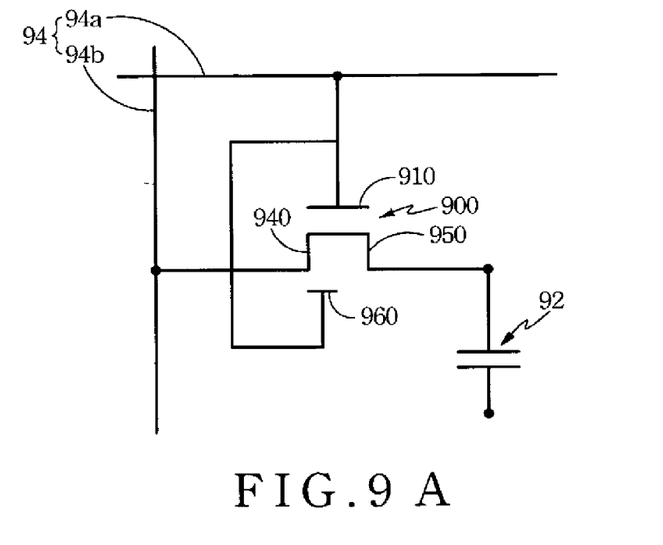
FIG. 9A is a circuit diagram of a first pixel structure having the dual-gate transistor of the present invention.

In actual application, the display panel includes a plurality of pixel structures. The above-mentioned embodiments of the dual-gate transistor of the present invention can act as a switch for the respective pixel structure. Referring to FIG. 9A is a circuit diagram illustrating a first pixel structure including the dual-gate transistor 900 of the present invention. The pixel structure further includes at least one capacitor 92 and at least one signal line 94 electrically connected to the transistor 900. The transistor 900 can be any of the above-mentioned embodiments in order to reduce the parasitic capacitance Cgs.

The signal line 94, preferably, includes a scan line 94a and a data line 94b, but is not limited thereto. The first gate 910 of the dual-gate transistor 900 is electrically connected to the scan line 94a and the second gate 960. In addition, the first electrode 940 of the dual-gate transistor 900 is electrically connected to the data line 94b and the second electrode 950 thereof is electrically coupled to the capacitor 92.

Figure 9B:
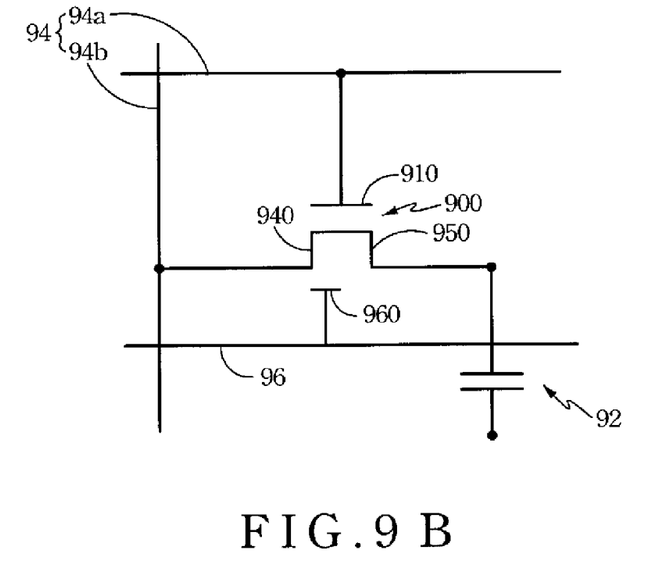
FIG. 9B is a circuit diagram of a second pixel structure having the dual-gate transistor of the present invention.

Referring to FIG. 9B is a circuit diagram illustrating a second pixel structure including the dual-gate transistor 900 of the present invention. The second pixel structure further includes at least one capacitor 92, at least one signal line 94, and at least one conducting wire 96. The transistor 900 can be any of the above-mentioned embodiments in order to reduce the parasitic capacitance (Cgs).

The signal line 94, preferably, includes a scan line 94a and a data line 94b, but is not-limited thereto. The first gate 910 of the dual-gate transistor 900 is electrically connected to the scan line 94a and the second gate 960 thereof is electrically connected to the conducting wire 96. In addition, the first electrode 940 of the dual-gate transistor 900 is electrically connected to the data line 94b and the second electrode 950 thereof is electrically coupled to the capacitor 92.

When the pixel structure is under operation, the scan line 94a transmits the scan signal (such as voltage, or others) to the dual-gate transistor 900, in which, the scan line 94a supplies a voltage to the first gate 910 while the conducting wire 96 supplies another voltage onto the second gate 960 so as to enable the semiconductor layer to sense the carrier (such as electric charge) and thus forming the current flow. Under this condition, the data line 94b transmits another signal (such as voltage, or others) via the first electrode 940 so that the current in the semiconductor layer flows into the capacitor 92 via the second electrode 950.

An important aspect to note is that in the first pixel structure of FIG. 9A, the substantially same voltage is transmitted to the first and second gates via the scan line 94a. For the second pixel structure of FIG. 9B, two substantially different voltages or the substantially same voltage can be transmitted to the first and second gates 910, 960 via the scan line 94a and the conducting wire 96 according to the practical operation.

Figure 10:
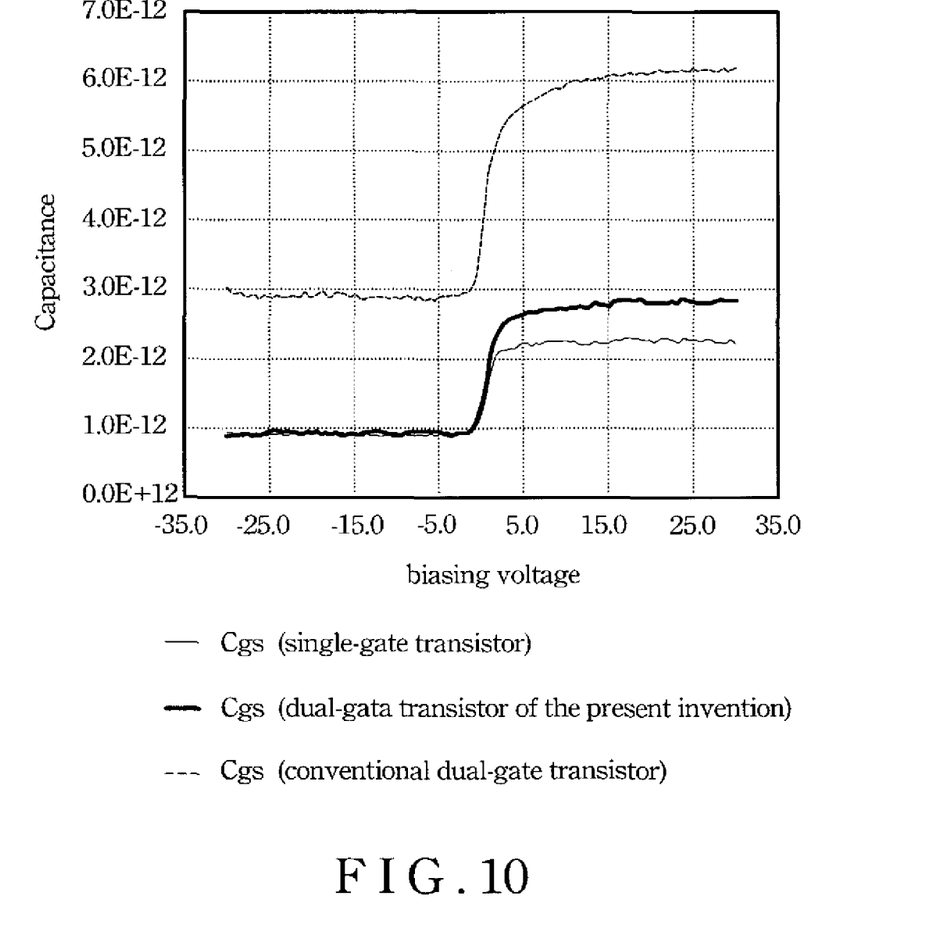
FIG. 10 is a graph illustrating the comparative values of parasitic capacitance in a single-gate transistor, the conventional dual-gate transistor and the dual-gate transistor of the present invention.

Referring to FIG. 10 is a graph illustrating three curves representing values of parasitic capacitance Cgs in the conventional single-gate transistor, the conventional dual-gate transistor, and the present dual-gate transistor under bias. It is clearly observable that the parasitic capacitance Cgs resulted by the dual-gate transistor of the present invention is magnificently lower than the conventional dual-gate transistor.

Therefore, when compared to the conventional dual-gate transistor, the dual-gate transistor of the present invention provides a greater current conductivity and subsequently reduces the photo leakage current problem. Since a smaller parasitic capacitance is resulted in compare to the conventional dual-gate transistor, a smaller operating voltage is required to switch on the present dual-gate transistor, thereby providing a stable display quality at the display panel.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A dual-gate transistor, comprising:
   a substrate;
   a bottom gate formed on the substrate;
   a first dielectric layer covering the bottom gate and the substrate;
   a semiconductor layer formed on the first dielectric layer over the bottom gate;
   first and second electrodes formed on the semiconductor layer and spaced from each other with an interval therebetween;
   a second dielectric layer formed on the substrate so as to cover the first electrode, the second electrode and portion of the semiconductor layer; and
   a top gate formed on the second dielectric layer, wherein both the top gate and the bottom gate have two opposite end sections, one end section of the top gate is overlapped with the first electrode and another end section of the top gate is non-overlapped with the second electrode, and the two opposite end sections of the bottom gate are overlapped with the first and second electrodes respectively.

2. The transistor of claim 1, wherein the top gate is overlapped with at least one third of the second dielectric layer within the interval.

3. The transistor of claim 1, wherein one end section of the first gate is adjacent to one end section of the second electrode.

4. The transistor of claim 3, wherein the other end section of the first gate is away from the end section of the second electrode, and overlaps at least part of the first electrode.

5. The transistor according to claim 1, wherein the semiconductor layer comprises amorphous silicon, poly-silicon, monocrystalline silicon, microcrystal silicon, or a combination thereof.

6. The transistor of claim 1, wherein one end section of the first gate is adjacent to a sidewall of the second electrode, and substantially located under at least one third of the second dielectric layer within the interval.

7. The transistor of claim 6, wherein the other end section of the first gate, is away from the sidewall of the second electrode, and substantially overlaps with at least one part of the first electrode.

8. The transistor of claim 1, wherein the first gate is substantially overlapped with at least one third of the second dielectric layer within the interval.

9. The transistor of claim 1, further comprising:
   an isolating layer formed on the semiconductor layer such that the first and second electrodes cover two opposite ends of the isolating layer and extend outward from the two opposite ends of the isolating layer, whereby an interval is defined between the first and second electrodes on the isolating layer.

10. The transistor of claim 1, wherein the semiconductor layer includes a channel layer and a doped semiconductor layer formed on the channel layer.

11. The transistor of claim 10, wherein the channel layer includes a first lightly doped sub-layer and a second lightly doped sub-layer formed on the first lightly doped sub-layer.

12. The transistor of claim 1, wherein the semiconductor layer includes at least one first doping region, at least one second doping region, and at least one non-doping region.

13. The transistor of claim 12, wherein two first doping regions are located at two opposite sides of the semiconductor layer, and the non-doping region is sandwiched between the two first doping regions at the two opposite sides of the semiconductor layer.

14. The transistor of claim 12, wherein the second doping region is sandwiched between the first doping region and the non-doping region.

15. The transistor of claim 12, wherein the non-doping region is sandwiched between the first doping region and the second doping region.

16. A pixel structure, comprising:
   the dual-gate transistor of claim 1;
   at least one capacitor electrically connected to the dual-gate transistor; and
   at least one signal line, electrically connected to the dual-gate transistor, and having a scan line and a data line.

17. The pixel structure of claim 16, wherein the bottom gate of the transistor is electrically connected to the scan line of the signal line, and connected electrically to the top gate of the transistor.

18. The pixel structure of claim 16, further comprising a conducting wire, wherein the bottom gate and the top gate of the dual-gate transistors are electrically connected to the scan line and the conduction wire, respectively.

19. A dual-gate transistor, comprising:
   a substrate;
   a bottom gate formed on the substrate;
   a first dielectric layer covering the bottom gate and the substrate;
   a semiconductor layer formed on the first dielectric layer over the bottom gate, and two opposite sides of the semiconductor layer having a source region and a drain region;
   a second dielectric layer formed on the semiconductor layer and the substrate;
   a top gate formed on the second dielectric layer over the semiconductor layer;
   a third dielectric layer covering the top gate and the substrate; and
   first and second electrodes formed on the third dielectric layer and electrically connected to the drain region and source region of the semiconductor layer respectively, wherein, the first and second electrodes are separated by an interval therebetween, and the top gate has two opposite end sections, one end section is overlapped with the drain region and another end section is non-overlapped with the source region.

* * * * *